(12) United States Patent
Andoh

(10) Patent No.: US 7,208,844 B2
(45) Date of Patent: Apr. 24, 2007

(54) SEMICONDUCTOR DEVICE

(75) Inventor: Seiji Andoh, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 22 days.

(21) Appl. No.: 10/766,938

(22) Filed: Jan. 30, 2004

(65) Prior Publication Data

US 2005/0093179 A1 May 5, 2005

(30) Foreign Application Priority Data

Oct. 31, 2003 (JP) .............................. 2003-372783

(51) Int. Cl.
*H01L 23/28* (2006.01)
(52) U.S. Cl. .................. 257/787; 257/678; 257/777
(58) Field of Classification Search ................ 257/787, 257/678, 777
See application file for complete search history.

(56) References Cited

U.S. PATENT DOCUMENTS 6,552,421 B2 * 4/2003 Kishimoto et al. ......... 257/678

FOREIGN PATENT DOCUMENTS

| JP | 11-163201 | 8/1999 |
| JP | 2000-133742 | 5/2000 |
| JP | 2001-217261 | 8/2001 |
| JP | 2002-057245 | 2/2002 |

OTHER PUBLICATIONS

Notice of Reason for Rejection dated Oct. 25, 2005.
Official Notice of Reason for Rejection dated Aug. 1, 2006.

* cited by examiner

*Primary Examiner*—Douglas Menz
(74) *Attorney, Agent, or Firm*—Nixon Peabody LLP; Donald R. Studebaker

(57) ABSTRACT

A semiconductor device including a substrate having a main surface including a first area, a second area surrounding the first area, and a third area surrounding the second area; a first insulating protective film that is provided in the first area and formed in a shape having no angles; a second insulating protective film provided in the third area; a semiconductor chip that is provided on the first insulating protective film and has a bottom surface facing to the first insulating protective film; and a sealing resin covering the semiconductor chip, wherein the bottom surface of the semiconductor chip covers the first area.

9 Claims, 5 Drawing Sheets

PLAN VIEW OF SEMICONDUCTOR DEVICE HAVING CONVENTIONAL BGA PACKAGE STRUCTURE

CROSS-SECTIONAL VIEW OF SEMICONDUCTOR DEVICE HAVING CONVENTIONAL BGA PACKAGE STRUCTURE

PLAN VIEW OF SEMICONDUCTOR DEVICE
ACCORDING TO FIRST EMBODIMENT

CROSS-SECTIONAL VIEW OF SEMICONDUCTOR DEVICE
ACCORDING TO SECOND EMBODIMENT

CROSS-SECTIONAL VIEW OF SEMICONDUCTOR DEVICE
ACCORDING TO THIRD EMBODIMENT

SCHEMATIC CROSS-SECTIONAL VIEW OF QUASI SEMICONDUCTOR DEVICE

SEMICONDUCTOR DEVICE

BACKGROUND OF THE INVENTION

1. Field of the Invention

The present invention relates to a semiconductor device having a ball grid array (BGA) package structure that is provided with a substrate for mounting a semiconductor chip thereon. This is counterpart of and claims priority to Japanese Patent Application No. 372783/2003 filed on Oct. 31, 2003, which is herein incorporated by reference.

2. Description of the Related Art

With increasing dissemination of small electronic equipment typically represented by mobile telephones, there has been increasing demand for smaller semiconductor devices installed in such equipment. To reduce the sizes of semiconductor devices, efforts have been made to increase the packaging density of the semiconductor devices. As one example of the efforts, semiconductor devices having the BGA package structure have been put into practical use.

A semiconductor device having the BGA package structure is equipped with a substrate for mounting a semiconductor chip thereon, the substrate having a built-in wiring structure. The wiring structure is constructed of interconnections, which serves as electrically conductive paths, extended in the substrate and on both main surfaces thereof.

A solder resist layer serving as an insulating protective film is formed on the interconnections. A semiconductor chip is mounted on the substrate by bonding it onto the solder resist layer through the intermediary of a die bonding layer composed of an adhesive insulating paste or the like. Both electrodes of the semiconductor chip and the interconnections are electrically connected by electrically conductive metal interconnections, such as gold interconnections. This means that the electrodes of the semiconductor chip and an external electrode terminal are electrically connected through the intermediary of the metal interconnections and the wiring structure built in the substrate. The semiconductor chip and the metal interconnection are hermetically secured onto one main surface of the substrate by a sealing resin.

It is known, however, that in the structure wherein the interconnections are disposed below an outer edge of the semiconductor chip through the intermediary of the solder resist layer, when so-called heat cycle durability test or heat cycle test in which semiconductor devices are periodically subjected to temperature changes is carried out, the interconnections below the outer edge of the semiconductor chip tend to break due to stress generated by temperature changes. Efforts have been made to prevent a failure of the semiconductor device attributable to such breaking of interconnections, one example of which has been disclosed in Japanese Unexamined Patent Application Publication No. 11-163201 (Patent Document 1).

According to Patent Document 1, the width of a interconnection disposed in a region located at a position opposing the outer edge of a semiconductor chip is, for example, set to be greater than the width of a wiring pattern disposed in a region that is out of the foregoing region and located at a position opposing areas outside and/or inside the outer edge of the semiconductor chip. Alternatively, interconnections are routed to cross aslant the outer edge of the semiconductor chip. Further alternatively, a semiconductor device is designed to avoid disposing interconnections in a region located at a position opposing the outer edge of a semiconductor chip as much as possible. By adopting these constructions, failures of semiconductor devices caused by broken interconnections are prevented.

SUMMARY OF THE INVENTION

It is an object of the present invention to provide a semiconductor device having a BGA package structure that is provided with a substrate for mounting a semiconductor chip thereon, the semiconductor device featuring high reliability by preventing broken interconnections on one main surface of the substrate.

To this end, the semiconductor device according to the present invention provides the following structural features.

According to one aspect of the present invention, a semiconductor device is provided, which includes a substrate having a main surface having a first region, a second region surrounding the first region, and a third region surrounding the second region, a first insulating protective film that is provided in the first region and formed in a shape having no angles, a second insulating protective film provided in the third region, a semiconductor chip that is provided on the first insulating protective film and has a bottom surface opposing the first insulating protective film, and a sealing resin covering the semiconductor chip, wherein the bottom surface of the semiconductor chip covers the first region.

According to another aspect of the present invention, a semiconductor device is provided, which includes a semiconductor chip having a bottom surface including a plurality of angular portions, a substrate having a main surface including a first region, a second region surrounding the first region, and a third region surrounding the second region, a first insulating protective film that is provided in the first region, opposes the bottom surface of the semiconductor chip, and has no angles on its outer edge closest to an angular portion of the bottom surface, a second insulating protective film provided in the third region, and a sealing resin covering the semiconductor chip, wherein the bottom surface of the semiconductor chip covers the first region.

According to yet another aspect of the present invention, a semiconductor device is provided, which includes a substrate having a main surface including a first region, a first sub-region surrounding the first region, a second sub-region surrounding the first sub-region, and a third region surrounding the second sub-region, an insulating protective film provided only in the first and third regions, an adhesive layer provided in the first sub-region, a semiconductor chip that is provided on the insulating protective film in the first region and on the adhesive layer, and has a bottom surface opposing the insulating protective film, and a sealing resin covering the semiconductor chip.

According to yet another aspect of the present invention, a semiconductor device is provided, which includes a substrate having a main surface including a first region, a second region surrounding the first region, a third region surrounding the second region, and a fourth region surrounding the third region, an insulating protective film provided only in the first and fourth regions, an adhesive layer provided in the second region, a semiconductor chip that is provided on the insulating protective film in the first region and on the adhesive layer, and has a bottom surface opposing the insulating protective film, and a sealing resin covering the semiconductor chip, wherein no interconnection is provided on the main surface below an outer edge of the semiconductor chip.

According to a further aspect of the present invention, a semiconductor device is provided, which includes a substrate having a main surface provided with interconnections, an insulating protective film provided on the main surface, a semiconductor chip that is provided on the insulating protective film and has a bottom surface opposing the insulating protective film, and a sealing resin covering the semiconductor chip, wherein a interconnection below the outer edge of the semiconductor chip is formed to be thicker than a remaining portion. Preferably, the interconnection below the outer edge of the semiconductor chip is formed to be larger than the remaining portion.

According to the inventive semiconductor devices described above, the insulating protective film is provided only in the first region and the fourth region. This means that an areas directly below an outer edge portion of the semiconductor chip and an area in the vicinity thereof are free of an insulating protective film formed of a material having a coefficient of thermal expansion that is significantly different from a coefficient of thermal expansion of a material constituting the semiconductor chip and that of a material constituting interconnections. This makes it possible to obviate or restrain the stress that is generated due to temperature changes and supposed to act on the insulating protective film.

It is presumed that breaking of interconnections is attributable to repeated application of stress from temperature cycles to an insulating protective film disposed on an outer edge portion of the semiconductor chip and an area in the vicinity thereof, and the repeatedly applied stress damages the insulating protective film. Accordingly, obviating or at least restraining the stress acting on the insulating protective film in the aforesaid area should be effective for preventing the breaking of interconnections.

The stress due to temperature changes that acts on the insulating protective film is higher in the outer edge portion of the semiconductor chip and the area in the vicinity thereof and the areas of the four corners of the semiconductor chip. Therefore, stress affects a wider range in these areas, so that providing the interconnections more extensively particularly in the four corner areas than the remaining area of the semiconductor chip should be further effective for preventing the breaking of interconnections.

The presence of a sealing resin between the semiconductor chip and the substrate means the presence of a filler or air bubble contained in the sealing resin, which is also responsible for the breaking of interconnections caused by stress from temperature changes in the semiconductor device. Hence, using a structure with no sealing resin between the semiconductor chip and the substrate eliminates the possibility of the presence of a remaining filler or an adhesive layer or air bubbles between the adhesive layer and the sealing resin. This should also contribute to the prevention of the breaking of interconnections.

Unlike the semiconductor device disclosed in Patent Document 1, the semiconductor device according to the present invention features a greater degree of freedom in wiring layout. More specifically, the technology disclosed in Patent Document 1 has certain limitation in designing the layout of wiring in an outer edge of the semiconductor chip, whereas the semiconductor device according to the present invention has no such limitation. A semiconductor device with still higher reliability can be accomplished by combining the construction of the semiconductor device disclosed in Patent Document 1 and the construction of the semiconductor device according to the present invention.

In a semiconductor device having a plurality of multilayer substrates, interconnections break on a surface of a substrate adjoining to a semiconductor chip, the substrate being provided adjacently to the semiconductor chip. The breaking of the interconnections will be prevented by designing such that the interconnections are not disposed on the semiconductor chip side surfaces of the substrates.

There are cases where design requires interconnections be disposed in an area wherein the breaking of interconnections tends to take place. In such a case, interconnections in this area are designed to be thicker than the remaining area only in the direction perpendicular to the main surface of the substrate so as to enhance the strength of the interconnections located in this particular area, thereby preventing the damage to the interconnections. In addition to making the interconnections thicker, the interconnections are made wider in the aforementioned area so as to further increase the strength of the interconnections in that particular area, permitting even more effective fulfillment of the object described above.

DESCRIPTION OF THE PREFERRED EMBODIMENTS

Figure 1:
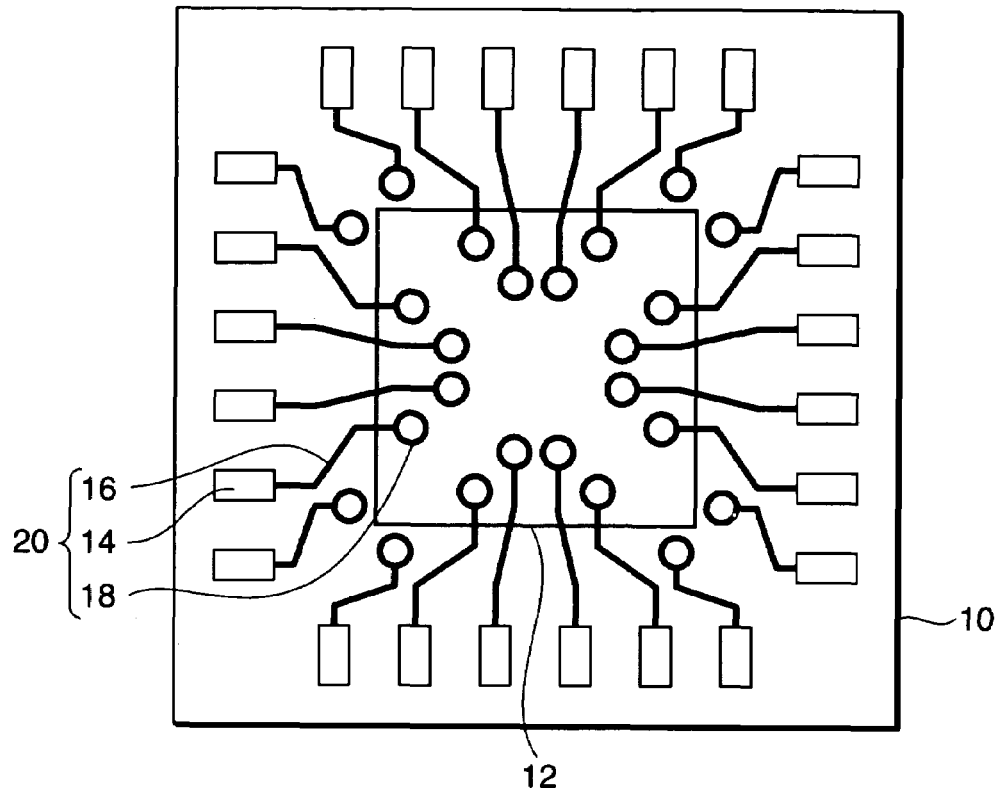
FIG. 1 is a plan view illustrating a semiconductor device having a conventional BGA package structure.

Embodiments in accordance with the present invention will now be described in conjunction with the accompanying drawings. The drawings merely schematically show the shapes, sizes and positional relationship among components to aid the understanding of the present invention. The present invention, therefore, should not be limited to the shown examples. The following will describe just preferred examples, and the present invention is not restricted to numeric conditions that will be shown. Like components in the figures will be assigned like reference numerals, and the explanation thereof may not be repeated.

To clearly show structural differences between a semiconductor device in accordance with the present invention and a conventional semiconductor device of a similar type, a structure of the conventional semiconductor device will be first explained with reference to FIGS. 1 and 2. In the following explanation, the term "conventional semiconductor devices of the similar type" may refer to ones other than the semiconductor devices in accordance with the present invention and the one disclosed in Patent Document 1, as appropriate.

FIG. 1 is a schematic plan view for explaining a conventional semiconductor device having a BGA package structure wherein a semiconductor chip, a sealing resin, and metal interconnections connecting electrodes of the semiconductor chip and interconnections have been removed. FIG. 1 is a schematic plan view observed from a direction perpendicular to one main surface of a substrate 10. FIG. 2 is a schematic cross-sectional view for explaining the structure of the conventional semiconductor device having the BGA package.

Figure 2:
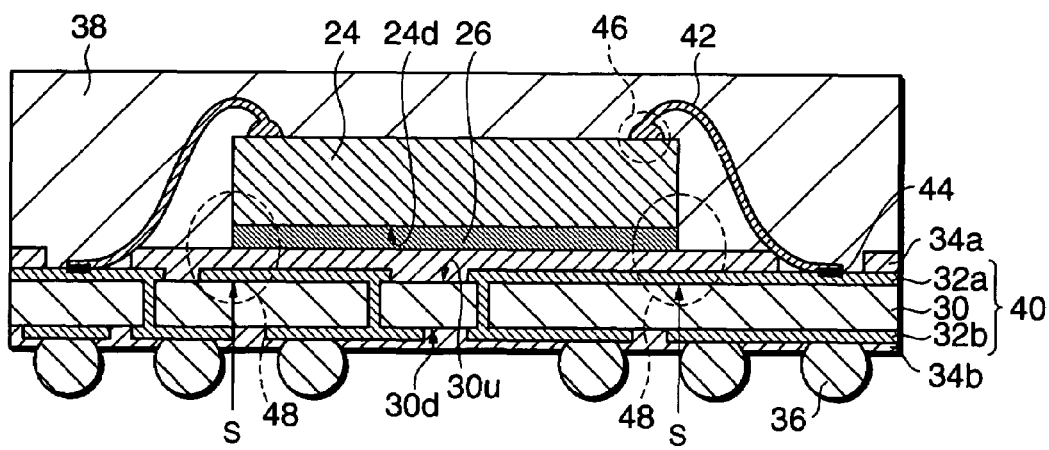
FIG. 2 is a schematic cross-sectional view illustrating the semiconductor device having the conventional BGA package structure.

For the purpose of ease of understanding the drawings, FIGS. 1 and 2 partly sacrifice accuracy in the geometric overlapping or the like in a depth direction in the drawings to an extent that will not lead to misunderstanding of the spirit of the present invention. This will apply to other plan views or cross-sectional views, which will be referred to in the following description.

Referring to FIG. 1, a wiring structure 20 is mounted on the substrate 10. The wiring structure 20 includes substrate bonding pads 14, interconnections 16, and through holes 18. A rectangle denoted by 12 (hereinafter referred to as "rectangle 12") shown in FIG. 1 indicates the position where a semiconductor chip will be installed, meaning that the four sides of the rectangle 12 show the outer edge of the semiconductor chip.

Referring now to FIG. 2, a cross-sectional structure of the conventional semiconductor device having a BGA package structure will be explained. The semiconductor device having the BGA package structure shown in FIG. 2 has a semiconductor chip 24 mounted on one main surface of a substrate 40 (corresponding to the substrate 10 in FIG. 1) that is constructed of an insulating wiring board 30 and electrically conductive interconnections 32$a$ and 32$b$, a sealing resin 38 covering them. One main surface of the substrate 40 here means a surface 30$u$ of the wiring board 30 constituting the substrate 40, which is adjacent to the mounted semiconductor chip 24. The same will apply in the following description.

The semiconductor device shown in FIG. 2 has only one substrate 40, whereas a plurality of the substrates 40 may be used in a multilayer structure. A semiconductor device composed of a plurality of laminated substrates will be explained in detail hereinafter by referring to FIG. 5B. In such a case, the substrates will be designated as a first substrate, a second substrate and so on in order from the one closest to a semiconductor chip, as necessary. However, for the convenience of explanation, whether a semiconductor device has only one substrate 40 or a plurality of substrates 40, the following description will be given on an assumption that the semiconductor device has a single substrate 40, unless it is necessary to distinguish them. It should be noted, however, even when the description is given of a semiconductor device having only one substrate 40, any other semiconductor devices equipped with a plurality of substrates 40 are not to be excluded.

The semiconductor chip 24 is closely attached to the wiring board 30 through the intermediary of a die bonding layer 26 serving as an adhesive layer, a solder resist layer 34$a$ serving as an insulating protective film, and the interconnection 32$a$. The die bonding layer 26 is deposited under the semiconductor chip 24, and the solder resist layer 34$a$ is deposited directly below the die bonding layer 26. Right below the solder resist layer 34$a$, there are an area wherein the interconnections 32$a$ are present and an area wherein the interconnections 32$a$ are absent but the solder resist layer 34$a$ and the wiring board 30 are present and directly in close contact.

The interconnections 32$b$ and the solder resist layer 34$b$ serving as the insulating protective film are also deposited on a back surface (hereinafter referred to as "the other main surface 30$d$") opposing the one main surface 30$u$ of the substrate 40. Solder balls 36 and the interconnections 32$b$ are bonded, as necessary. When the solder balls 36 and the interconnections 32$b$ are joined, a solder resist layer 34$b$ does not exist between the solder balls 36 and the interconnections 32$b$.

The semiconductor chip 24 and the substrate 40 are electrically connected by a metal interconnection 42. More specifically, one end of the metal interconnection 42 is interconnection-bonded to a bonding pad 46 of the semiconductor chip 24, which is adjacent to the semiconductor chip 24, while the other end of the metal interconnection 42 is interconnection-bonded to a bonding pad 44 (corresponding to the component denoted by 14 in FIG. 1) that is adjacent to the substrate.

The conventional semiconductor device having the BGA package structure previously discussed has been posing a problem in that interconnections in an area under the outer edge of the semiconductor chip 24 and an area in the vicinity thereof (hereinafter, both areas may be referred to as "the areas under the outer edge") break due to stress caused by temperature changes.

A surface 24$d$ of the semiconductor chip 24 on which the substrate is mounted is referred to as a mounting surface. An area under the semiconductor chip 24 is defined as the area that is formed by perpendicularly projecting the semiconductor chip 24 from the mounting surface side to the main surface 30$u$ of the substrate 40 that is parallel to the mounting surface, and wherein a projected image of the semiconductor chip 24 is present. Hence, the area below the outer edge of the semiconductor chip 24 is located at a position corresponding to the outline of the projected image of the semiconductor chip 24. In FIG. 2, a below-the-outer-edge region 48 is indicated by enclosing them with dotted-line ellipse, the position thereof on the main surface 30$u$ of the substrate 40 that corresponds to the area below the outer edge of the semiconductor chip 24 being indicated by arrows S.

The below-the-outer-edge region 48 encircled by the ellipses of dotted lines is where interconnections are to be provided. If interconnections are extended in the below-the-outer-edge region 48, the portions of the interconnections in these areas break. Hence, the below-the-outer-edge region 48 will be called as the interconnection-breaking-prone area.

The structure between the semiconductor chip 24 and the substrate 40 in the interconnection-breaking-prone region 48 will now be described. The structure is a multilayer structure in which the following layers are deposited in the order in which they are listed. The die bonding layer 26 serving as the adhesive layer is deposited directly under the semiconductor chip 24, the solder resist layer 34$a$ serving as an insulating protective film is deposited directly under the die bonding layer 26, the interconnections 32$a$ are deposited directly under the solder resist layer 34$a$, and the wiring board 30 is deposited directly under the interconnections 32$a$. The coefficients of thermal expansion of the materials used for the semiconductor chip 24, the die bonding layer 26, the solder resist layer 34$a$, the interconnections 32$a$, and the wiring board 30, respectively, are different from each other, the coefficient of thermal expansion of the material used for the solder resist layer 34$a$ in particular being significantly different from those of the remaining materials.

In the semiconductor device having the BGA package structure, the semiconductor chip is made of a silicon or compound semiconductor. Since the interconnections are made of electrically conductive metal material, the coefficient of thermal expansion thereof is not very different from a semiconductor material used for the semiconductor chip.

Accordingly, if the interconnections 32a exist below the semiconductor chip 24 through the intermediary of the solder resist layer 34a having a significantly different coefficient of thermal expansion, then the stress attributable to temperature changes that develops in the interface of the interconnections 32a and the solder resist layer 34a will be extremely higher than the stress developed in the interface at a location out of the interconnection-breaking-prone region 48 away from the position directly under the outer edge of the semiconductor chip 24. In other words, it is presumed that the stress causes damage to the solder resist layer 34a, and the damage to the solder resist layer 34a leads to the breaking of the interconnections 32a positioned in the interconnection-breaking-prone region 48.

Accordingly, the present invention proposes a specific structure that allows prevention of breaking of interconnections by providing an ingenious sectional structure of the interconnection-breaking-prone region 48. An embodiment in accordance with the present invention will now be described.

<First Embodiment>

Figure 3:
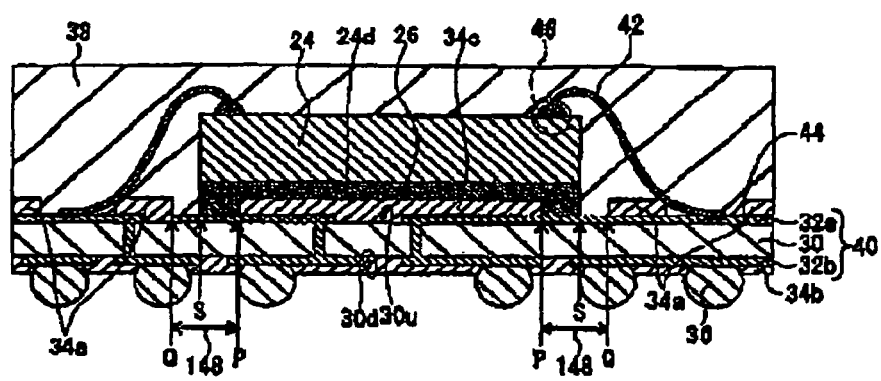
FIG. 3 is a schematic cross-sectional view illustrating a semiconductor device having a BGA package structure according to a first embodiment.
Figure 4:
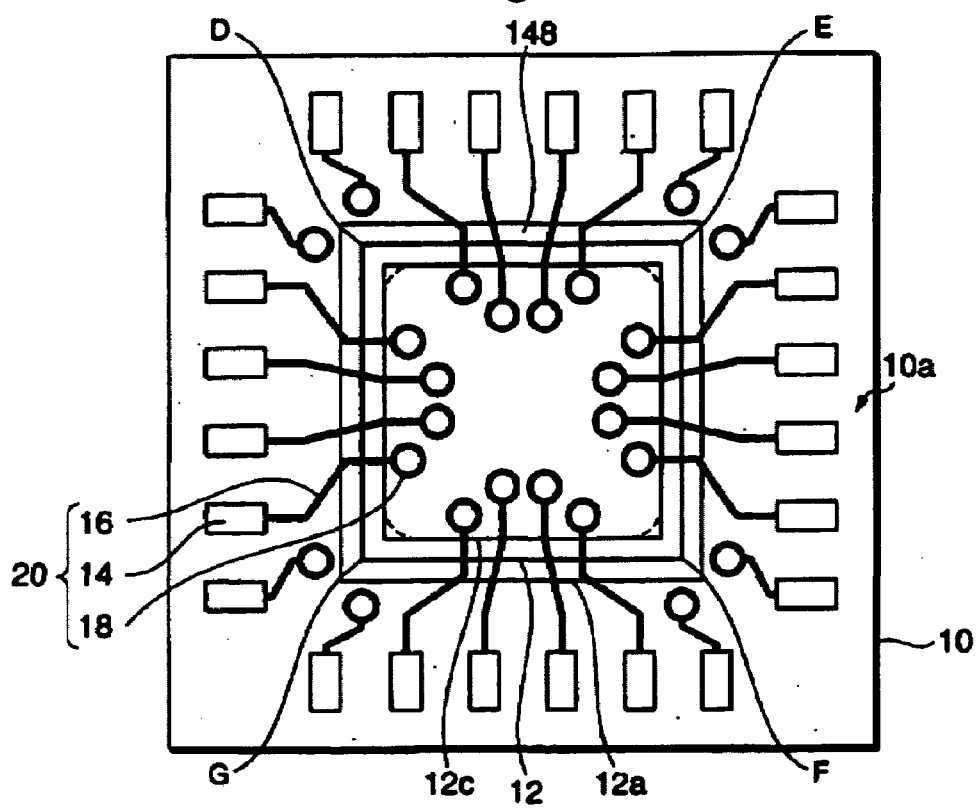
FIG. 4 is a plan view illustrating the semiconductor device having a BGA package structure according to the first embodiment.

Referring to FIGS. 3 and 4, a construction of a semiconductor device having a BGA package structure according to a first embodiment will be explained. FIG. 3 is a schematic cross-sectional view for explaining the construction of the semiconductor device having the BGA package structure according to the first embodiment. FIG. 4 is a schematic plan view showing the semiconductor device having the BGA package structure according to the first embodiment shown in FIG. 3. FIG. 4 schematically shows the semiconductor device from which a semiconductor chip, a sealing resin, and metal interconnections connecting electrodes of the semiconductor chip and interconnections have been removed. FIG. 4 is a schematic plan view observed from a direction perpendicular to one main surface of a substrate 10.

Referring to FIG. 3, the first embodiment in accordance with the present invention structurally differs from the conventional semiconductor device having the BGA package structure in that the solder resist layer serving as the insulting protective film is not deposited in the interconnection-breaking-prone region 48, which is a second region, as discussed above. Specifically, in this embodiment, the aforementioned interconnection-breaking-prone region 48 is formed as a interconnection-breaking-preventive region 148 for protecting interconnections from breaking due to stress developing around the positions S directly under the outer edge of the semiconductor chip 24.

In FIG. 3, the interconnection-breaking-preventive region 148 is indicated as the region defined by arrows P and Q. The positions of the arrows P and Q respectively correspond to the outline position of the aforementioned interconnection-breaking-prone region 48 shown in FIG. 2.

The interconnection-breaking-preventive region 148 is free of the solder resist layer, so that a solder resist layer 34c existing between one main surface 30u of a substrate 40 and a mounting surface 24d opposing the main surface 30u of the substrate 40 of a semiconductor chip 24, and a solder resist layer 34a existing in region excluding the regions 148 are discontinuously deposited. An area wherein the solder resist layer 34c is formed is a first region, and an area wherein the solder resist layer 34a is formed is a third region. Furthermore, the area defined by the arrows P and Q is a second region. The second region is formed of a first sub-region defined by the arrow P and an arrow S, and a second sub-region defined by the arrows S and Q. In the following explanation, $S_1$, $S_2$, $S_3$, $S_1'$, and $S_2'$ corresponding to the arrow S, P', P''' corresponding to the arrow P, and Q' and Q''' corresponding to the arrow Q all indicate boundaries defining the first region, the second region, the third region, the first sub-region, and the second sub-region, respectively, as in the case previously discussed.

Except for the above aspects, the structure of the first embodiment is identical to that of the conventional semiconductor device having the BGA package structure, so that the description will be omitted.

Referring now to FIG. 4, the configurations of the interconnection-breaking-preventive regions defined by the arrows P and Q in FIG. 3 will be explained. The substrate 10 (corresponding to the substrate 40 in FIG. 3) has a wiring structure 20 including bonding pads 14 adjacent to the substrate, interconnections 16, and through holes 18.

In FIG. 4, a rectangle 12 indicates the position where a semiconductor chip is mounted. This means that the four sides of the rectangle 12 are the outer edge of the semiconductor chip 24. The rectangle indicated by a thin line 12c (hereinafter referred to as "the rectangle 12c" in some cases) indicates the outline of a projected image obtained when a solder resist layer 34c is perpendicularly projected onto one main surface 10a of the substrate 10. The rectangle 12c therefore indicates the outer edge of the solder resist layer 34c. The area inside the rectangle 12c is the first region. A thin line 12a (hereinafter referred to as "the rectangle 12a" in some cases) indicates the outline of a projected image obtained when a solder resist layer 34a is perpendicularly projected onto one main surface 10a of the substrate 10. The rectangle 12a therefore indicates the outer edge of the solder resist layer 34a. The area outside the rectangle 12a is the third region. The band-shaped area (the second region) sandwiched by the rectangle 12a and the rectangle 12c is the interconnection-breaking-preventive region 148. According to the structure described above, no solder resist layers exist in the interconnection-breaking-preventive region 148.

As previously described, the coefficient of thermal expansion of the material constituting the semiconductor chip 24 and that of the material constituting the wiring board 30 are different. Hence, when a completed semiconductor device is subjected to temperature cycles during a temperature cycle test, different stresses are developed in the solder resist layer 34c, which is the insulating protective film existing directly under the semiconductor chip 24 and in the solder resist layer 34a existing out of an area directly under the semiconductor chip 24. However, according to the structure of the semiconductor device of the first embodiment, the solder resist layers 34a and 34c are provided apart from each other, the interconnection-breaking-preventive region 148, which is the region under the outer edge of the semiconductor chip 24, located therebetween. Therefore, the interconnection-breaking-preventive region 148 is free of any solder resist layers. According to the semiconductor device, therefore, the interconnections 32a can be protected from breaking.

The inventors of the present invention have found appropriate dimensions of the interconnection-breaking-preventive region while making efforts to identify possible causes of failures of semiconductor devices screened out as defectives by the temperature cycle test. A dimension of the band-shaped interconnection-breaking-preventive region (hereinafter referred to as "the width of the interconnection-breaking-preventive region" in some cases) sandwiched between the rectangle 12a and the rectangle 12c is set to be at least 0.4 mm on both sides of the rectangle 12 indicating the outer edge of the semiconductor chip 24. This allows the prevention of breaking of the interconnections. In other words, the interconnections can be protected from breaking by setting the gap between the sides of the rectangle 12 and the sides of the rectangle 12a parallel to the former and the gap between the rectangle 12 and the rectangle 12c parallel to the former to 0.4 mm. This means that breaking of the interconnections can be prevented by setting a width of at least 0.4 mm on both sides of the rectangle 12 indicating the outer edge of the semiconductor chip 24 so as to set the width of the interconnection-breaking-preventive region to 0.8 mm.

It has been also found while making efforts to identify possible causes of failures of semiconductor devices screened out as defectives by the temperature cycle test that the stress generated in the solder resist layer 34a caused by temperature changes exists in the region under the outer edge of the semiconductor chip, and that the stress is higher in the regions at four corner D, E, F, and G of the semiconductor chip (hereinafter referred to as "angular portions" in some cases). More specifically, interconnections can be further effectively protected from breaking by forming the interconnection-breaking-preventive region to be larger in the regions at the four corners D, E, F, and G of the semiconductor chip than in the remaining region, that is, by forming the solder resist layer serving as the first insulating protective film such that its surface opposing the substrate of the semiconductor chip has no angular portions. The solder resist layer formed in the third region provides the second insulating protective film.

In order to make the regions at the four corner D, E, F, and G of the interconnection-breaking-preventive region larger than the remaining region in the semiconductor chip 24, the four corners of the rectangle 12c indicating the outer edge of the solder resist layer 34c are formed into, for example, arcs inside the rectangle 12c, as indicated by the dotted lines in FIG. 4, rather than the square shape or angular shape in the regions at the four corners D, E, F, and G of the semiconductor chip 24. Thus, the corners of the semiconductor chip surface opposing the substrate do not have angular portions. In short, the regions at the four corners D, E, F, and G of the first insulating protective film have an angle-free shape.

Obviously, the shape of the regions at the four corners D, E, F, and G of the semiconductor chip 24 is not limited to the arcs tangent to the rectangle 12c at its internal corner portions. The outer edge of the solder resist layer 34c acting as the first insulating protective film may have any shape as long as it makes the regions of the four corners D, E, F, and G of the semiconductor chip 24 larger than the remaining region.

Appropriate dimensions to be set for the four corners of the rectangle 12c indicating the outer edge of the solder resist layer 34c have been found while making efforts to identify possible causes of failures of semiconductor devices screened out as defectives by the temperature cycle test. It has been found that breaking of the interconnections can be prevented by setting the distance from each of the four corners D, E, F, and G of the rectangle 12 indicating the outer edge of the semiconductor chip 24 to its closest outer edge of the solder resist layer 34c (the arcs shown by the dotted lines in FIG. 4) to at least 10% of the length of the diagonal line of the semiconductor chip 24.

As described above, the stress caused by temperature changes and applied to the interconnections is higher in the regions at the four corners D, E, F, and G of the semiconductor chip. Therefore, adopting the structure explained above will add to the effect for preventing breaking of interconnections.

Furthermore, as also previously described, if a sealing resin exists between the main surface 30u and the mounting surface 24d of the semiconductor chip 24 that opposes the main surface 30u of the substrate 40, then air bubbles may be contained at boundaries of the granular structure thereof. The presence of the air bubbles, therefore, also leads to the stress generated by temperature variations in the semiconductor device, contributing to the breaking of interconnections.

The inventors of the present invention have performed a simulation to study the magnitude of the stress observed when a sealing resin exists between the main surface 30u and the mounting surface 24d of the semiconductor chip 24 that opposes the main surface 30u of the substrate 40. Simulation results will be described in conjunction with FIGS. 7A, 7B, and 7C.

Figure 7A:
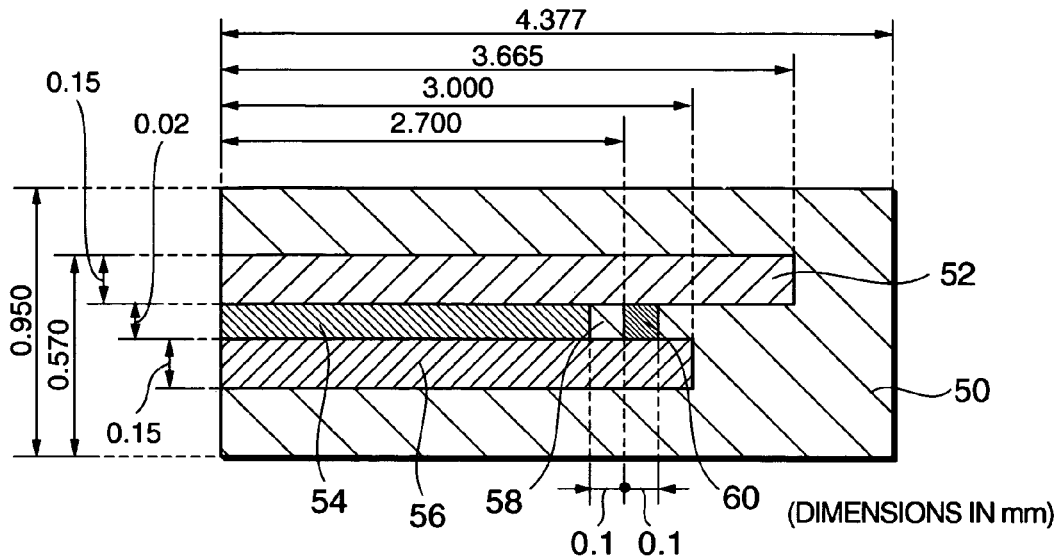
FIG. 7A, FIG. 7B, and FIG. 7C are schematic cross-sectional views illustrating quasi semiconductor devices used for a simulation.
Figure 7B:
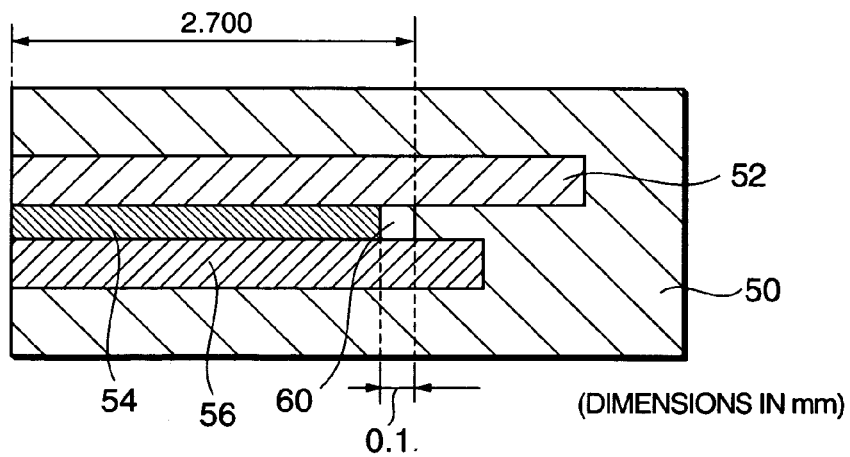
Figure 7C:
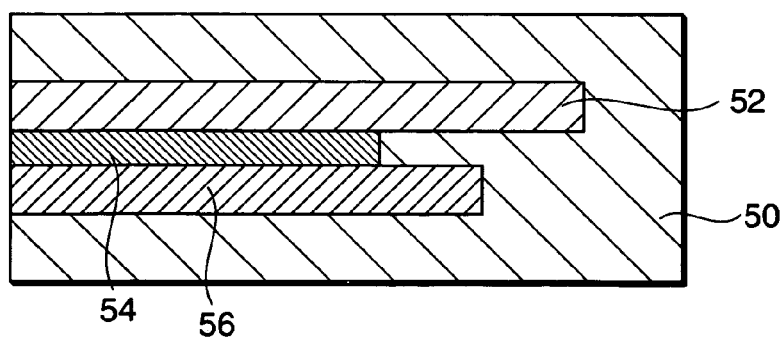

FIGS. 7A, 7B, and 7C are schematic cross-sectional views of quasi semiconductor devices used for the simulation.

A quasi semiconductor device A used for the simulation shown in FIG. 7A is constituted of a quasi semiconductor chip 52 supposed to be a semiconductor chip, a quasi die bonding layer 54 supposed to be a die bonding layer acting as an adhesive layer, and a quasi wiring board 56 supposed to be a wiring board, which are deposited in close contact and surrounded by a quasi sealing resin 50. An air bubble 58 and a filler 60 are sandwiched between the quasi wiring board 56 and the portion of quasi semiconductor chip 52 wherein the quasi die bonding layer 54 is absent. The dimensions of the aforesaid quasi semiconductor chip 52, etc. that constitute the structure used for the simulation are shown in millimeters in FIG. 7A. FIG. 7B also shows dimensions in millimeters, but the dimensions of the same portions as those in FIG. 7A are not shown.

A quasi semiconductor device B used for the simulation shown in FIG. 7B differs from the quasi semiconductor device A shown in FIG. 7A in that no air bubble 58 is present. The rest is the same as that shown in FIG. 7A. A quasi semiconductor device C used for the simulation shown in FIG. 7C has a configuration wherein the air bubble 58 and the filler 60 are absent between the quasi semiconductor chip 52 and the quasi wiring board 56.

To perform the simulation, it was assumed that the coefficient of thermal expansion of the material used for the quasi wiring board 56 is $0.5 \times 10^{-5}/°$ C., the coefficient of thermal expansion of the material used for the quasi die bonding layer 54 is $3.5 \times 10^{-5}/°$ C., the coefficient of thermal expansion of the material used for the quasi semiconductor chip 52 is $0.3 \times 10^{-5}/°$ C., and the coefficient of thermal expansion of the material used for the filler 60 is $0.7 \times 10^{-5}/°$ C. These values are equal to virtually averages of the values of the materials constituting an actual semiconductor device.

Simulation results indicated that the stress applied to the front surface of the quasi wiring board 56 that is in contact with the filler 60 at a position where the filler 60 exists, and the front surface of the quasi semiconductor chip 52 was 4.9 kg/mm² in the quasi semiconductor device A. In the quasi semiconductor device B, the stress applied to the front surface of the quasi wiring board 56 that is in contact with the filler 60 at a position where the filler 60 exists, and the front surface of the quasi semiconductor chip 52 was 6.8 kg/mm². In the quasi semiconductor device C, the stress acting on the surface of the quasi semiconductor chip 52 that is in contact with the die bonding layer 54 at a position of the outer edge of the quasi wiring board 56, and the surface of the quasi wiring board 56 that is in contact with the quasi die bonding layer 54, respectively, was 0.1 kg/mm².

In the simulation, the quasi semiconductor device C is a model of the first embodiment of the present invention. The quasi semiconductor device C is characterized by its construction that has no sealing resin in the region sandwiched by the quasi semiconductor chip 52 and the wiring board 56. The simulation results have proved that the construction makes it possible to reduce the stress attributable to breaking of interconnections.

The actual semiconductor device will now be discussed in more detail. As explained in conjunction with FIG. 3, in the area located between the main surface 30u and the mounting surface 24d of the semiconductor chip 24, which opposes the main surface 30u of the substrate 40, and in the interconnection-breaking-preventive region, the die bonding layer 26 exists directly below the mounting surface 24d, the interconnections 32a exists directly below the die bonding layer 26, and the main surface 30u exists directly below the interconnections 32a. In the area located between the mounting surface 24d and the main surface 30u and in the interconnection-breaking-preventive region, the die bonding layer 26 exists directly below the mounting surface 24d, and the main surface 30u exists below the interconnections 32a. In either case, the sealing resin 38 is absent between the mounting surface 24d and the main surface 30u.

Adopting the construction described above eliminates the possibility of a filler or air bubble, which may be contained in the sealing resin 38, being observed in a step for heating and solidifying a sealing resin. This means that the aforementioned construction eliminates the possibility of stress being generated in the thermal cycle test attributable to the presence of a filler or air bubble. Thus, it can be concluded that the structure described above is effective for preventing breaking of interconnections.

Figure 5A:
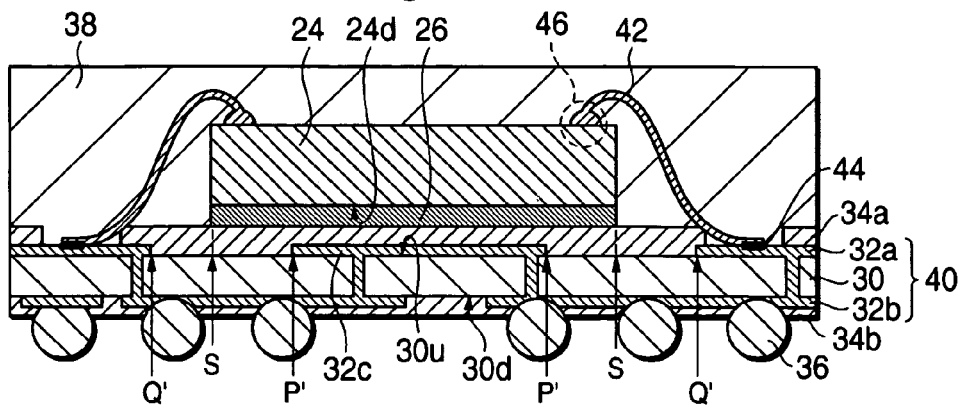
FIG. 5A and FIG. 5B are schematic cross-sectional views illustrating a semiconductor device having a BGA package structure according to a second embodiment.
Figure 5B:
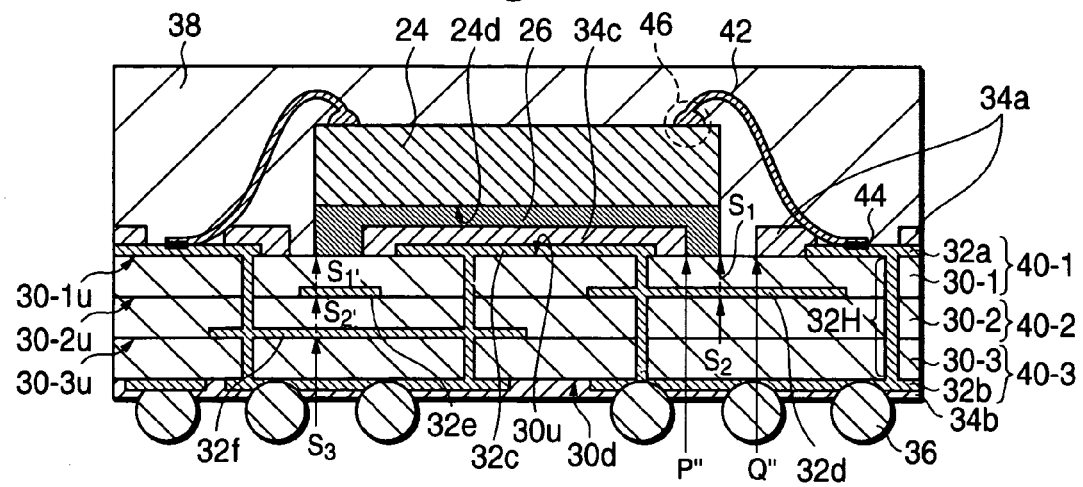

<Second Embodiment>Referring now to FIGS. 5A and 5B, the structure of a semiconductor device having a BGA package structure according to a second embodiment will be described. FIGS. 5A and 5B are schematic cross-sectional views for explaining the structure of the semiconductor device having a BGA package structure according to the second embodiment. The following description will refer to a structural difference between the semiconductor device according to the second embodiment and the conventional semiconductor device having the BGA package structure.

The semiconductor device shown in FIG. 5A has a single substrate 40, whereas the semiconductor device shown in FIG. 5B has a plurality of (three in the figure) substrates 40-1, 40-2, and 40-3.

In the semiconductor device shown in FIG. 5A, no interconnections exist between a main surface 30u of the substrate 40 and a solder resist layer 34a in a interconnection-breaking-prone region defined by P' and Q'. A part of a technological concept of the inventive semiconductor device shown in FIG. 5A has already been disclosed in Patent Document 1. More specifically, Patent Document 1 has disclosed a semiconductor device in which no interconnections are formed in a interconnection-breaking-prone region on the substrate 40 provided adjacently to a semiconductor chip 24 through the intermediary of a die bonding layer 26.

However, the inventors of the present invention have verified by examining a number of heat cycle test results that the aforementioned considerations are unnecessary for the interconnections provided on the substrates 40-2 and 40-3 except for the interconnections formed on one main surface of the substrate 40-1 provided adjacently to the semiconductor chip 24 in the semiconductor device having a plurality of (three in the case shown in FIG. 5B) laminated substrates 40-1, 40-2, and 40-3, as in the semiconductor device shown in FIG. 5B.

More specifically, the interconnections existing in the interconnection-breaking-prone region can be protected from breaking by laying them such that they are spaced away from the solder resist layer 32a by detouring them toward the other main surface 30d of the substrate 40. The following embodiment illustrates a semiconductor device having the aforesaid construction.

The following description will be given of a semiconductor device having three substrates as an example for the purpose of convenience. The number of substrates, however, is not limited to three, and the following description will directly apply to a semiconductor device having two or more substrates. In the following description, the substrate provided adjacently to the semiconductor chip 24 will be denoted as 40-1. The subsequent substrates provided on the other main surface 30d of the substrate 40-1, which is the surface on the opposite side from the semiconductor chip 24 are numbered in order, such as 40-2, 40-3 and so on, beginning from the substrate 40-1 provided adjacently to the semiconductor chip 24 so as to identify them. For the convenience of explanation, the substrate 40-1 may be expressed as the first substrate, the substrate 40-2 may be expressed as the second substrate, and the substrate 40-3 may be expressed as the third substrate.

The semiconductor device according to the second embodiment of the present invention has the semiconductor chip 24 on the main surface 30u of the first substrate 40-1 through the intermediary of a die bonding layer 26, as shown in FIG. 5B. Solder balls 36 are mounted on the other main surface 30d of the third substrate 40-3, which is on the opposite side from the main surface on which the semiconductor chip 24 is mounted.

The main surface of the first substrate 40-1 that is on the opposite side from the mounting surface thereof and the main surface of the second substrate 40-2 that faces the semiconductor chip 24 are continuously formed with the same material unless any interconnections exist. These surfaces will be therefore denoted as a main surface 30-2u of the second substrate 40-2. Similarly, the main surface of the second substrate 40-2 that is on the opposite side from the surface adjacent to the semiconductor chip 24 and the main surface of the third substrate 40-3 on the side adjacent to the semiconductor chip 24 are continuously formed with the same material unless any interconnections exist. These surfaces will be therefore denoted as a main surface 30-3u of the third substrate 40-3.

Referring to FIG. 5B, there are no interconnections in a interconnection-breaking-prone region that is defined by P''' and Q''' and has its center set at a position $S_1$ on a main surface 30-1u of the substrate 40-1 that corresponds to a location below the outer edge of the semiconductor chip 24 on the main surface 30-1u of the substrate 40-1. Similarly, there are no interconnections also in a interconnection-breaking-prone region having its center set at a position corresponding to another position $S_1'$ where the outer edge line of the semiconductor chip 24 exists on the main surface 30-1u of the substrate 40-1.

Meanwhile, a interconnection 32d is disposed in a region corresponding to the interconnection-breaking-prone region on the main surface 30-2u of the substrate 40-2, having its center set at a position $S_2$ where the outline of a perpendicularly projected image of the semiconductor chip 24 exists on the main surface 30-2u of the substrate 40-2. Similarly, a interconnection 32e is disposed in a region corresponding to the interconnection-breaking-prone region having its center set at a position $S_2'$ where the outline of a perpendicularly projected image of the semiconductor chip 24 exists on the main surface 30-2u of the substrate 40-2. Furthermore, a interconnection 32f is disposed in a region corresponding to the interconnection-breaking-prone region having its center set at a position $S_3$ where the outline of a perpendicularly projected image of the semiconductor chip 24 exists on the main surface 30-3u of the substrate 40-3.

In other words, interconnections can be disposed even under the outer edge of the semiconductor chip as long as they are formed on the main surface 30-2u of the substrate 40-2 and the main surface 30-3u of the substrate 40-3 other than the main surface 30-1u of the substrate 40-1. This is because stress acting on the main surface 30-2u of the substrate 40-2 or the main surface 30-3u of the substrate 40-3 is sufficiently smaller than the stress that is caused by temperature changes and takes place in a interconnection-breaking-prone region existing on the main surface 30-1u of the substrate 40-1, so that it does not reach a stress level that causes breaking of the interconnections formed on the main surface 30-2u of the substrate 40-2 or the main surface 30-3u of the substrate 40-3.

The positions $S_2$ and $S_2'$ are set at the boundary of a wiring board 30-1 and a wiring board 30-2, and the position $S_3$ is set at the boundary of the wiring board 30-2 and a wiring board 30-3. The wiring boards 30-1, 30-2, and 30-3 are formed using materials having the same coefficient of thermal expansion. Hence, the wiring boards 30-1, 30-2, and 30-3 reduce the stress attributable to temperature changes taking place at positions on the main surfaces 30-2u and 30-3u of the substrates 40-2 and 40-3, respectively, where the outline of the perpendicularly projected image of the semiconductor chip 24 exists. It is presumed, therefore, that interconnections formed at the positions $S_2$, $S_2'$, and $S_3$ are not subjected to stress that causes the interconnections to break during a heat cycle test.

Thus, it is possible to dispose necessary interconnections on the main surface 30-2u of the substrate 40-2 or the main surface 30-3u of the substrate 40-3 via through holes by detouring them so as to avoid the position $S_1$ where the outline of a perpendicularly projected image of the semiconductor chip 24 exists on the main surface 30-1u of the substrate 40-1. The through holes are interconnections installed perpendicularly with respect to main surfaces of a substrate to electrically connect interconnections formed on different main surfaces of substrates. An example of through holes shown in FIG. 5B is denoted by 32 H passing through the substrates 40-1, 40-2, and 40-3. The aforementioned structure makes it possible to prevent breaking of interconnections caused by temperature changes in the interconnections, leading to higher reliability of semiconductor devices.

<Third Embodiment>

Figure 6:
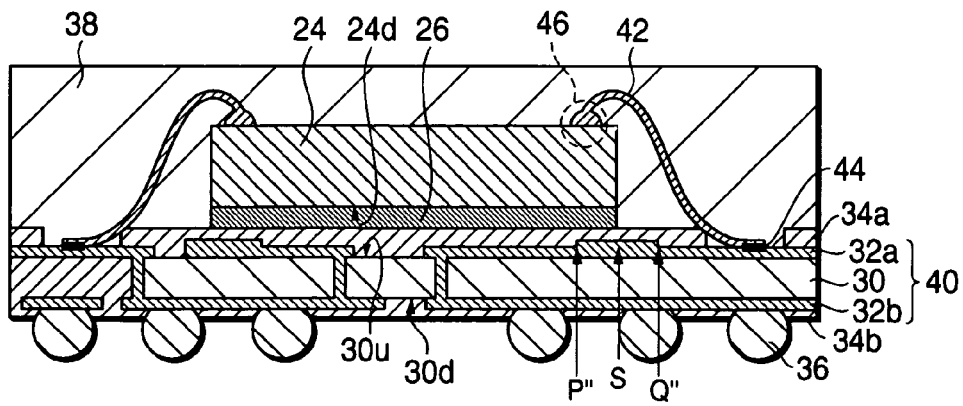
FIG. 6 is a schematic cross-sectional view illustrating a semiconductor device having a BGA package structure according to a third embodiment.

Referring now to FIG. 6, a description will now be given of a structure of a semiconductor device having a BGA package structure in accordance with a third embodiment. The third embodiment is structurally characterized in that a interconnection disposed in a interconnection-breaking-prone region defined by arrows P" and Q" in FIG. 6 is formed to be thicker than in the remaining region only in a direction perpendicular to a main surface 30u. The interconnection-breaking-prone region has its center indicated by an arrow S on one main surface 30u of a substrate 40, the position thereof corresponding to a position below the outer edge of a semiconductor chip 24.

The aforementioned structure wherein a interconnection having an adequate thickness for surviving stress generated due to temperature changes is formed in a interconnection-breaking-prone region obviously makes it possible to prevent interconnections from breaking that used to happen in a interconnection-breaking-prone region.

Particularly in a case where design inevitably requires a interconnection be disposed in a interconnection-breaking-prone region, the structure of the semiconductor device according to the third embodiment is effectively used. In this case, the interconnection in the interconnection-breaking-prone region is formed to be thicker in the direction perpendicular to main surfaces of the interconnection in the interconnection-breaking-prone region than in the remaining region, so that the strength of the portion of the interconnection disposed in the stress region can be increased. Thus, the object of protecting interconnections of a wiring pattern from breakage can be fulfilled, permitting higher reliability of a semiconductor device to be achieved.

The inventors of the present invention have examined a number of heat cycle test results and verified that breaking of interconnections in a wiring pattern can be prevented by setting the thickness of a interconnection in a interconnection-breaking-prone region in the direction perpendicular to the main surfaces of the interconnection to at least 0.50 µm.

It is needless to say that the aforesaid object will be further effectively fulfilled by making a interconnection in a interconnection-breaking-prone region to be thicker than in other regions in the direction perpendicular to a main surface 30u and also wider in the interconnection-breaking-prone region than in other regions. Specifically, as disclosed in Patent Document 1, the aforesaid object will be further effectively accomplished to improve the reliability of a semiconductor device by combining the structure disclosed in Patent Document 1 in which a interconnection disposed in a interconnection-breaking-prone region is made wider than in the remaining region and the structure in which a interconnection disposed in a interconnection-breaking-prone region is made thicker, as described in the third embodiment according to the present invention.

The inventors of the present invention have examined a number of heat cycle test results and verified that breaking of interconnections in a wiring pattern can be prevented by setting the width of a interconnection in a interconnection-breaking-prone region to at least 0.70 µm.

Semiconductor devices in accordance with the present invention are not limited only to the first through third embodiments described above. By arbitrarily and ideally combining the structural conditions disclosed above, the present invention can be applied to semiconductor devices constituted by using substrates having interconnections on surfaces thereof or on the surfaces thereof and therein.

Thus, the present invention makes it possible to provide highly reliable semiconductor devices having BGA package structures capable of preventing breaking of interconnections formed on main surfaces of substrates.

What is claimed is:

1. A semiconductor device comprising:
   a substrate having a main surface including a first area, a second area surrounding the first area, and a third area surrounding the second area;
   a first insulating protective film that is provided on the first area and formed in a shape having no angles;
   a second insulating protective film provided on the third area;
   a die bonding layer formed on the first insulating protective film and the second area of the substrate;
   a semiconductor chip that is provided on the die bonding layer and has a bottom surface facing the die bonding layer; and a sealing resin covering the semiconductor chip,
wherein the bottom surface of the semiconductor chip covers the first area and a part of the second area.

2. The semiconductor device according to claim 1, wherein the semiconductor has a first rectangular shape, the first area has a second rectangular shape that is smaller than the first rectangular shape and the second area has a predetermined width.

3. The semiconductor device according to claim 1, wherein the substrate has a plurality of interconnections locating from the first area to the third area through the second area.

4. The semiconductor device according to claim 3, wherein the substrate further has a plurality of bonding pads connected to the interconnections.

5. The semiconductor device according to claim 4, wherein the bonding pads are located on the third area.

6. The semiconductor device according to claim 3, wherein the substrate further has a plurality of through holes connected to the interconnections.

7. The semiconductor device according to claim 6, wherein the through holes are located on the first area.

8. The semiconductor device according to claim 1, wherein the substrate has a back surface opposite to the main surface and wherein the substrate has a plurality of conductive terminals located on the back side of the substrate.

9. The semiconductor device according to claim 8, wherein the conductive terminals are solder balls.

* * * * *